(12) United States Patent
Linne et al.

(10) Patent No.: US 9,835,489 B2
(45) Date of Patent: Dec. 5, 2017

(54) VECTOR SENSOR FOR MEASURING PARTICLE MOVEMENT IN A MEDIUM

(71) Applicant: Totalforsvarets forskningsinstitut, Stockholm (SE)

(72) Inventors: Markus Linne, Stockholm (SE); Peter Sigray, Hagersten (SE)

(73) Assignee: TOTALFORSVARETS FORSKNINGSINSTITUT, Stockholm (SE)

( * ) Notice: Subject to any disclaimer, the term of this patent is extended or adjusted under 35 U.S.C. 154(b) by 0 days.

(21) Appl. No.: 15/027,816

(22) PCT Filed: Oct. 3, 2014

(86) PCT No.: PCT/SE2014/000122
§ 371 (c)(1),
(2) Date: Apr. 7, 2016

(87) PCT Pub. No.: WO2015/053678
PCT Pub. Date: Apr. 16, 2015

(65) Prior Publication Data
US 2016/0252391 A1    Sep. 1, 2016

(30) Foreign Application Priority Data

Oct. 8, 2013   (SE) ...................... 1300635

(51) Int. Cl.
*G01H 11/02*    (2006.01)
*G01R 33/028*   (2006.01)
(Continued)

(52) U.S. Cl.
CPC ............... *G01H 11/02* (2013.01); *G01P 5/02* (2013.01); *G01R 33/028* (2013.01);
(Continued)

(58) Field of Classification Search
CPC ........ G01V 3/18; G01V 1/186; G01R 35/005; G01P 5/02; G01S 15/588
(Continued)

(56) References Cited

U.S. PATENT DOCUMENTS 3,514,693 A    5/1970   Cagniard
6,031,377 A    2/2000   Watkins
(Continued)

FOREIGN PATENT DOCUMENTS

CN    102564566    7/2012
CN    102879077    1/2013

OTHER PUBLICATIONS

Zhou et al. Submerged buoy system for ocean sound field measurement based on vector sensor. Transducer and Microsystem Technologies Year 2009, Issue 10, pp. 82-84.
(Continued)

*Primary Examiner* — Melissa Koval
*Assistant Examiner* — Trung Nguyen
(74) *Attorney, Agent, or Firm* — Jacobson Holman, PLLC.

(57) ABSTRACT

The present invention relates to a vector sensor for measuring particle movement in a medium. The vector sensor comprises a magnetic body that is held at a certain distance from a magnetometer in such a way that the magnetic body can move in time with a passing particle movement, wherein the magnetometer is arranged to detect the oscillations in the magnetic field that the movements in the medium produce.

11 Claims, 3 Drawing Sheets

(51) Int. Cl.
  *G01S 7/534* (2006.01)
  *G01S 15/58* (2006.01)
  *G01R 33/02* (2006.01)
  *G01P 5/02* (2006.01)
  *G01V 1/18* (2006.01)

(52) U.S. Cl.
  CPC .......... *G01R 33/0213* (2013.01); *G01S 7/534* (2013.01); *G01S 15/588* (2013.01); *G01V 1/186* (2013.01)

(58) Field of Classification Search
  USPC .......... 324/207.22, 200, 202, 233, 262, 345, 324/239, 654–657, 600
  See application file for complete search history.

(56) References Cited

U.S. PATENT DOCUMENTS 6,862,536 B2 * 3/2005 Rosin ................ G01N 15/0266
                                                    175/66
2012/0138291 A1 * 6/2012 Tomberlin ............ E21B 47/026
                                                    166/254.2
2017/0067969 A1 * 3/2017 Butters .................. G01R 33/26

OTHER PUBLICATIONS

Shipps et al. The use of vector sensors for underwater port and waterway security. Proceedings from the Sensor for Industry Conference, Jan. 27-29, 2004, pp. 41-44.

Pavan et al. Magnetic tracking of acoustic radiation force-induced micro-order displacement. IEEE Transactions on Ultrasonics, Ferroelectrics and Frequency Control, vol. 58, No. 5, May 1, 2011, pp. 909-915.

Kamimura et al. Pressure transducer for measuring acoustic radiation force based on a magnetic sensor; Prssure transducer for measuring acoustic radiation force based on magnetic the sensor. Measurement Science and Technology, vol. 22, No. 1, Dec. 1, 2010, p. 15101.

* cited by examiner

VECTOR SENSOR FOR MEASURING PARTICLE MOVEMENT IN A MEDIUM

The present invention relates to a vector sensor for measuring particle movement in a medium, e.g. water, based on magnetic field measurement. The particle movement can be linked to e.g. sound waves or a translation that is caused by a body that moves in the medium.

The difference between a vector sensor and a hydrophone that is used in water is that the hydrophone only measures the pressure at one point, while a vector sensor measures any of the following quantities—the relative position x, velocity x' or acceleration x"—for a particle at the point in question. Vector sensors that measure movement in water are known. Without further information an oscillation direction cannot be determined unambiguously, but the oscillation direction is doubly undetermined. To exclude one direction, two sensors can be used for each direction axis at a known distance from one another. By measuring the phase difference in the signals between the sensors, the direction to the source can be determined within a frequency interval, the upper limit of which is set by half of the distance between the sensors. The lower limit is set by the sensitivity of the measuring apparatus. Pure translation naturally has no frequency, but in this case the direction can be measured using only one sensor, but not using one or more hydrophones. Known vector sensors of this kind are constructed in different ways with different strengths and weaknesses.

A classic variant is to use a number of hydrophones in known positions and measure the pressure difference between them over time. If four hydrophones are used, the direction can be calculated in three dimensions for an incident wave. An advantage of such a system is that it is relatively simple to construct and the direction to the source can be determined according to the reasoning in the previous paragraph. A disadvantage is that the system is relatively unwieldy with a lot of cabling and many couplings, which can interfere with the measurements, and that hydrophones can vary in sensitivity in certain directions. Hydrophones cannot measure pure translations in the medium either.

Another solution comprises a three-axis accelerometer fixed inside a sphere that is substantially buoyancy-neutral in water. The sphere has a slight buoyancy and is held in place by a thread or the cord that transfers data from the accelerometer to a computer for further calculations. An accelerometer senses movements when e.g. a sound wave passes it and the oscillation direction can be calculated in a known manner. It also senses pure translations of particle movements in the medium. An advantage of this solution is that the vector sensor is quite small and flexible to use. A disadvantage is that such a system requires high precision and rigidity in the material. The attachment of the accelerometer etc. must be stable, since otherwise resonances are formed at certain frequencies that are due to the construction. The cord that transfers data can also cause damping of the movement detection and the sphere's centre of mass can be displaced, so that false angle information is produced for the oscillation direction. Attention must be paid to the cord's buoyancy neutrality and rigidity with this.

Said known solutions above have disadvantages and the present invention indicates another solution to the problem by constructing a vector sensor for use in a medium, especially water, in that the invention has the special features that are evident from the independent claims below. Other claims relate to suitable embodiments of the invention.

BRIEF DESCRIPTION OF THE DRAWINGS

The invention will be described below with reference to the enclosed drawings, in which.

Figure 1:
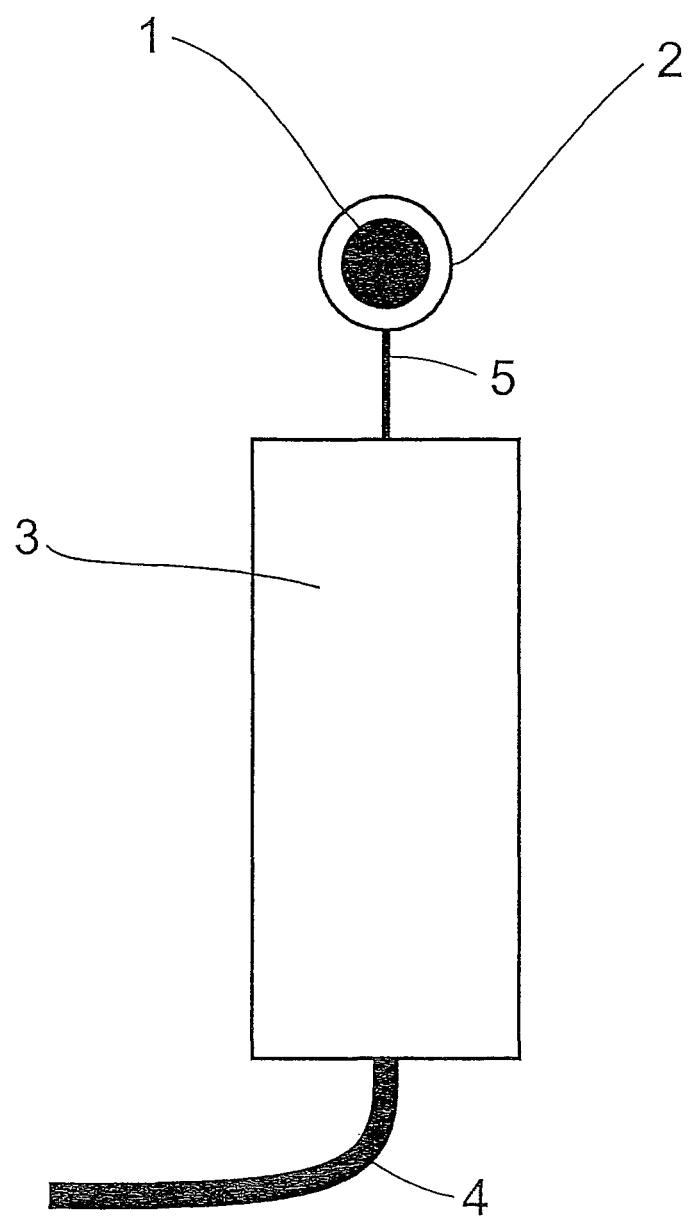
FIG. 1 shows a first embodiment of the invention.

The basic idea of the invention is that a body 1, 2 of magnetic material that is nearly buoyancy-neutral, with a density that substantially corresponds to the surrounding medium, is held at a certain distance from a three-axis magnetometer 3 in such a way that the magnetic body can move in time with a passing sound wave or another type of movement in the medium. When such a wave or other movement propagates through the medium and passes the magnetic body, this moves in the same direction and at the same amplitude and frequency as the wave. The movement can then be detected by the magnetometer as changes in the magnetic field, sent via a signal cable 4 or in another way to a computer and there be sampled and signal-processed further in a known manner.

For a good result, the density between the magnetic body and the medium should be substantially in correspondence. A deviation by a maximum of 5% normally gives a good result.

The sensitivity of the vector sensor system is determined among other things by the distance between the magnetic body 1, 2 and the magnetometer 3 (a shorter distance gives a higher sensitivity) and by the strength of the magnetic field at the magnetic body. The size of the magnetic body has an influence on how high the frequencies that can be measured are. The upper limit frequency lies in the area where the wavelength is of the same order of magnitude as the diameter of the magnetic body. Taken together this means that it is expedient to use magnetic material that produces a strong magnetic field. A conceivable material is neodymium, which is strongly permanently magnetic. Other magnetic materials are also conceivable, however.

When the wavelength is of the same magnitude as the diameter of the magnetic body 1, 2, it is important to have knowledge about its form. If the magnetic body is not spherical it does not produce the same response for different angles of incidence. For longer wavelengths the form of the magnetic body means less and for really long wavelengths it should be able to be up to and including a cube or a right parallelepiped without producing angular dependence.

To achieve suitable buoyancy it is normally necessary to surround the magnetic core 1 in the magnetic body with an envelope 2 of a material other than that of the core, so that together they acquire the desired buoyancy. A possible material for the envelope is Divinycell, but other materials are also conceivable. The magnet core and the surrounding material should be solid and fixedly connected to each other to prevent or minimise natural frequencies.

Depending on the desired sensitivity and size of the system, the magnetometer 3 can be of the three-axis fluxgate magnetometer type with a fixed iron core or a magnetometer that comprises coils or any other type. It is of course possible to use three separate, suitably oriented uniaxial magnetometers instead of a three-axis magnetometer. In applications in which there is no interest in a detection in three dimensions, restriction is possible to measuring along one or two axes. In a laboratory arrangement with a medium in a tube, a uniaxial magnetometer can be sufficient.

In a simple embodiment according to FIG. 1, the magnetic body 1, 2 has a slight lifting power and is held in position in relation to the magnetometer 3 by a thread 5, cf. a gas balloon on a string. As indicated to be expedient above, the magnetic body in the current example is substantially spherical. When a sound wave passes the magnetic body, for example, it vibrates in time and direction with the sound wave, which is registered by the magnetometer.

Since the magnetic body 1, 2 and the construction otherwise can be smaller than the known vector sensors described by way of introduction, the invention permits measurement at higher frequencies. Furthermore, it is easier to control resonances in the system compared with the known solution with an accelerometer in a sphere. One difficulty, however, is knowing the position of the magnetic body exactly in relation to the magnetometer 3 and thereby also acquiring a good knowledge of the direction and amplitude of the movement. However, successful experiments have been performed using a specific embodiment of the invention in which the magnetic body was a sphere and had a diameter of 2 cm and the magnetometer was placed approx. 5 cm from it.

Figure 2:
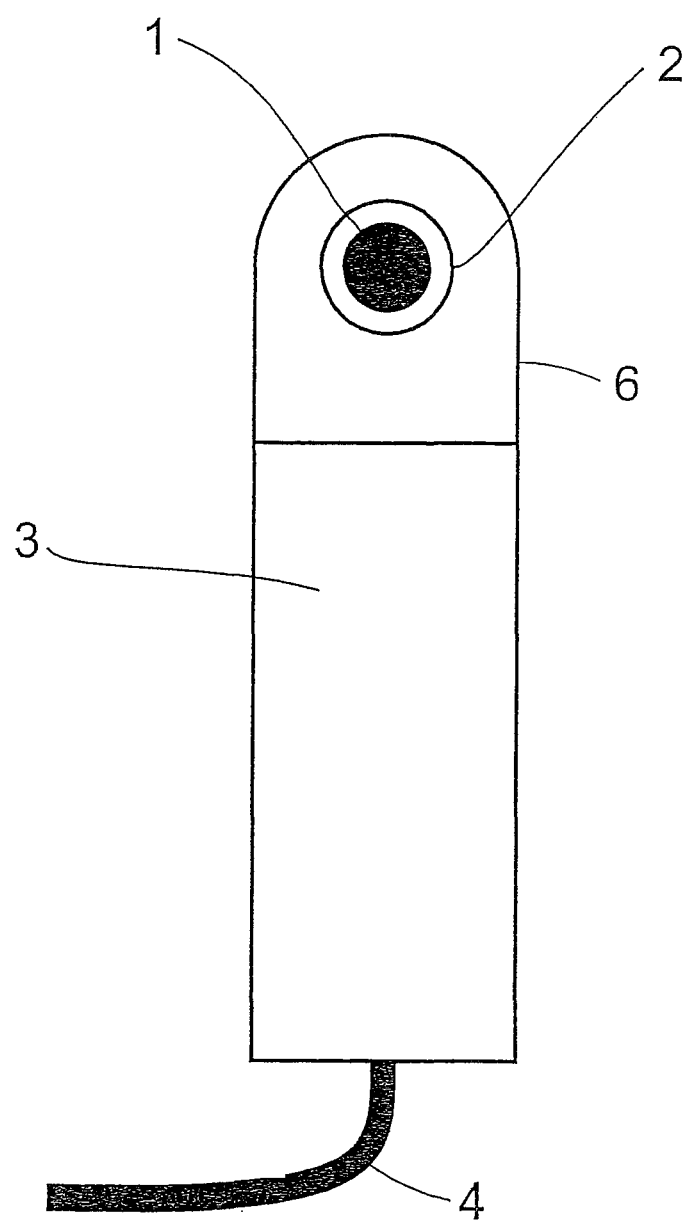
FIG. 2 shows a second embodiment of the invention and
FIG. 3 shows a third embodiment of the invention.

To avoid the difficulty of knowing the position of the magnetic body 1, 2 exactly in relation to the magnetometer 3, a construction according to FIG. 2 can be used. This solution also offers other advantages. Among other things, the construction is very easy to handle, since everything sits together. In this embodiment also the magnetic body must be nearly buoyancy-neutral in the manner indicated previously. For the movement to be able to propagate uninterruptedly through the material, the magnetic body in this embodiment is embedded in a suitable elastomer material 6 that matches the acoustic properties in the surrounding medium, e.g. water. There are many rubber materials that match the acoustic properties of water. Such a material that is used for hydrophone castings by the company Teledyne Reson is called "chloroprene vulcanised rubber".

It is easy to minimise the size of the magnetic body using this solution. The limit for the size of the magnetic core depends on the sensitivity of the magnetometer. An interesting possibility that has not yet been tested is to produce a multisensor system comprising a mat of elastomer, preferably rubber, with magnetic spheres in the order of millimeters embedded and mini-magnetometers on the underside.

There are other applications of the invention according to the main claim. A variant of the embodiment in FIG. 1 can be of interest in measurements of particle movements in more rigid (solid) material, e.g. concrete/cement, wood, ice etc., where the magnetic body 1, 2 is embedded in the material, while the magnetometer 3 is placed close to the surface at a measuring event. In these cases no coupling is required by thread to the magnetic body, at the same time as its position is more exact. This solution can be used e.g. for passive measurements of vibrations in bridge constructions and can also check how these change over time.

Figure 3:
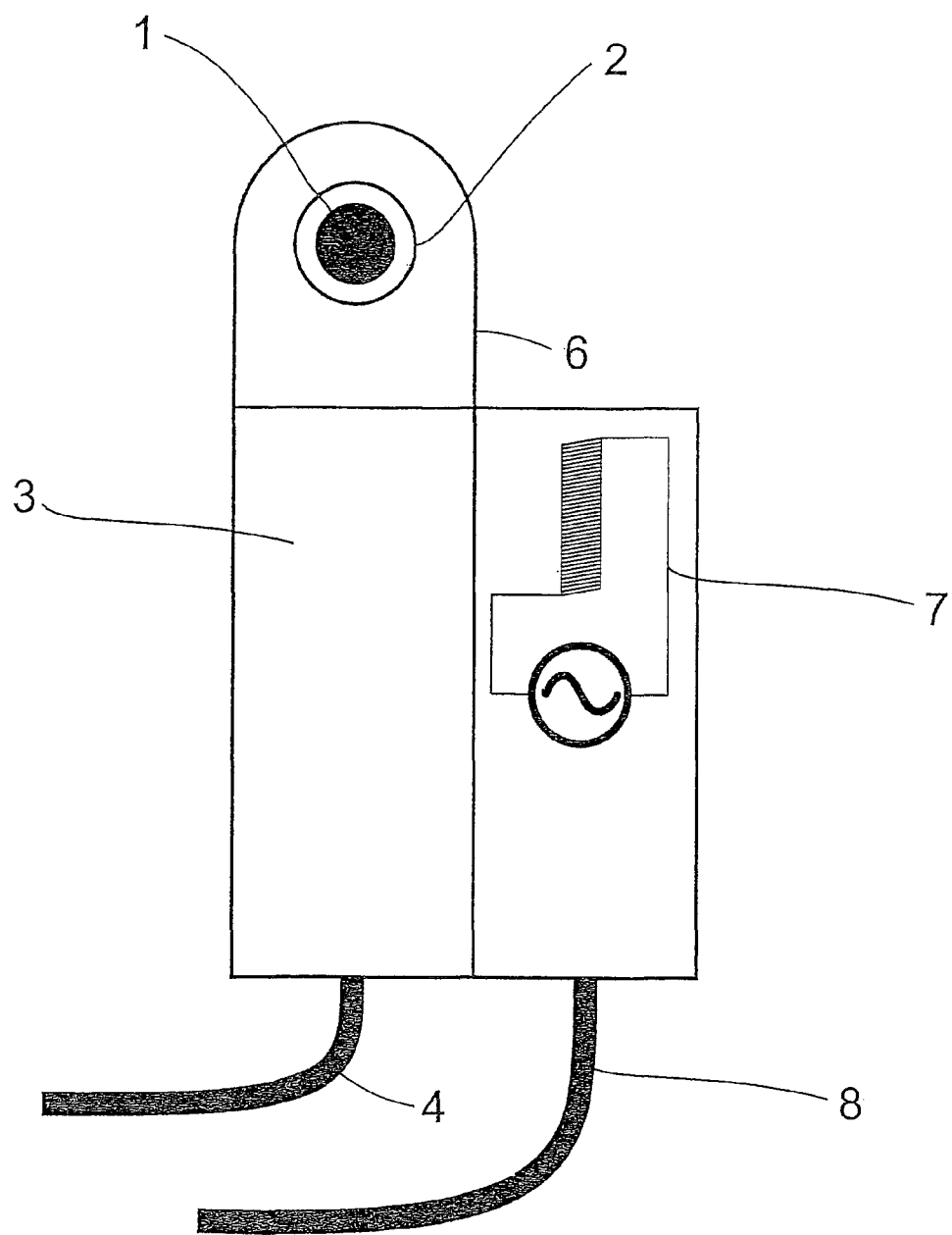

An interesting possibility that is available with an arrangement according to FIG. 2 is, through further equipment, to use the arrangement as a transmitter and then passively study the reflections received using the arrangement in its basic form. For this purpose special coils 7 can be attached close to the magnetic body 1, 2 and the magnetometer 3 and an alternating current of the desired frequency can be sent through them through a cable 8, which means that the magnetic body starts to oscillate in time and direction with the magnetic field that is created by the coils. An arrangement of this kind is shown in FIG. 3. With the oscillation the movement is induced further in the medium and the magnetic body becomes a transmitter, and since the oscillation direction can be controlled through the supply to the coils, it can become directive. Reflections from oscillations that reach different objects in the surrounding medium can then be detected using the arrangement in its passive basic form. If the magnetometer 3 is of a type that comprises coils that permit current to be actively conducted through these, it can be considered to use these in the active phase to induce oscillations in the magnetic body instead of using special coils for this.

With an arrangement of this kind, sound pulses can be sent off in certain directions, following which the reflected signals are detected. In certain cases, one directional vector in the doubly undetermined oscillation movement can thereby be eliminated and the vector towards the source obtained.

To have a better directivity in transmission, it can be necessary to have other geometrical forms of the magnetic body, e.g. cylindrical, cubic etc. Here it is important to remember that at frequencies at which the wavelength corresponds to the dimensions of the magnetic body, a different resolution of signals received is obtained depending on the direction of the sound. For lower frequencies this does not entail a problem if the wavelength is substantially longer than the size of the body.

The invention claimed is:

1. A vector sensor that in a passive mode measures movements in a medium, preferably caused by sound waves, characterised by that it comprises a magnetic body with a density that is substantially buoyancy-neutral in the medium, a magnetometer, a signal processing arrangement, wherein the magnetic body is held at a certain distance from the magnetometer in such a way that the magnetic body can move in time with a passing particle movement, the magnetometer is disposed to detect the oscillations in the magnetic field that the movements in the medium give rise to and the signal processing arrangement calculates the direction of the movement based on the output signals from the magnetometer, and characterized in that it comprises, for an active transmission mode, a signal generating arrangement and one or more coils arranged in connection with the magnetic body, through which coils an alternating current is disposed to be conducted that is calculated and supplied from the signal generating arrangement, wherein the signal generating arrangement is disposed to supply the coils so that the magnetic field that they create causes the magnetic body to vibrate in a manner that gives the desired directivity of the vibrations it transmits to the medium, and that the vector sensor in the passive mode is disposed to detect reflections of vibrations that were transmitted in the active mode.

2. The vector sensor according to claim 1, characterised by that the magnetometer contains the coils that are used in the active mode.

3. The vector sensor according to claim 1, characterised by that the density of the magnetic body lies within +5% of the density of the surrounding medium.

4. The vector sensor according to claim 1, characterised by that the magnetic body is substantially spherical.

5. The vector sensor according to claim 1, characterised by that the magnetic sensor body consists of a magnetic core and a surrounding envelope selected to give the core and the envelope together the desired density.

6. The vector sensor according to claim 1, characterised by that the magnetic core consists of neodymium.

7. The vector sensor according to claim 1, characterised by that the medium consists of water.

8. The vector sensor according to claim 1, characterised by that the magnetic body is embedded in a suitable elastomer material that matches the acoustic properties in the surrounding medium.

9. The vector sensor according to claim 1, characterised by that the magnetic body has a slightly lower density than the surrounding medium and is held in position by a thread or a thread-like arrangement.

10. A multisensor system comprising a plurality of vector sensors according to claim 1, comprising a plurality of magnetic sensor bodies embedded in a mat of elastomer, which interact with magnetometers on the underside of the mat.

11. The multisensory system according to claim 10, wherein the elastomer is of rubber.

\* \* \* \* \*